(12) United States Patent
Hung et al.

(10) Patent No.: US 12,328,862 B2
(45) Date of Patent: Jun. 10, 2025

(54) SEMICONDUCTOR STRUCTURE AND MANUFACTURING METHOD THEREOF

(71) Applicant: Winbond Electronics Corp., Taichung (TW)

(72) Inventors: Shih-Han Hung, Taichung (TW); Feng-Jung Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 454 days.

(21) Appl. No.: 18/073,478

(22) Filed: Dec. 1, 2022

(65) Prior Publication Data
US 2024/0188277 A1 Jun. 6, 2024

(51) Int. Cl.
*H10B 12/00* (2023.01)

(52) U.S. Cl.
CPC .......... *H10B 12/09* (2023.02); *H10B 12/315* (2023.02); *H10B 12/34* (2023.02); *H10B 12/50* (2023.02)

(58) Field of Classification Search
CPC .. H10B 12/0335; H10B 12/09; H10B 12/315; H10B 12/34; H10B 12/48; H10B 12/482; H10B 12/485; H10B 12/488; H10B 12/50
See application file for complete search history.

(56) References Cited

U.S. PATENT DOCUMENTS

| | | | |
|---|---|---|---|
| 7,396,772 B2 | 7/2008 | Lee et al. | |
| 8,188,529 B2 | 5/2012 | Nakamura et al. | |
| 2018/0294266 A1* | 10/2018 | Wang | H10B 12/09 |
| 2020/0381439 A1* | 12/2020 | Ikeda | H10B 12/482 |

* cited by examiner

*Primary Examiner* — Brook Kebede
(74) *Attorney, Agent, or Firm* — JCIPRNET

(57) ABSTRACT

A semiconductor structure including a substrate, buried word line structures, a transistor structure, a first hard mask layer, hard mask marks, a second hard mask layer, and contacts. The substrate includes a first region and a second region. The buried word line structures are located in the substrate in the first region. The transistor structure is located on the substrate in the second region. The first hard mask layer is located on the transistor structure. The first hard mask layer has recesses. The hard mask marks are located in the recesses. The second hard mask layer is located on the substrate in the first region. The second hard mask layer has openings. The contacts are located in the openings.

20 Claims, 8 Drawing Sheets

SEMICONDUCTOR STRUCTURE AND MANUFACTURING METHOD THEREOF

BACKGROUND

Technical Field

The invention relates to a semiconductor structure and a manufacturing method thereof, and particularly relates to a semiconductor structure and a manufacturing method thereof which can effectively reduce the manufacturing cost and the process complexity.

Description of Related Art

Currently, some semiconductor structures may include different semiconductor devices located in different regions. For example, some semiconductor structures may include the memory device located in the memory cell region and the transistor device located in the peripheral circuit region. However, how to reduce the manufacturing cost and the process complexity of the semiconductor structure is the goal of continuous efforts.

SUMMARY

The invention provides a semiconductor structure and a manufacturing method thereof, which can effectively reduce the manufacturing cost and the process complexity.

The invention provides a semiconductor structure, which includes a substrate, buried word line structures, a transistor structure, a first hard mask layer, hard mask marks, a second hard mask layer, and contacts. The substrate includes a first region and a second region. The buried word line structures are located in the substrate in the first region. The transistor structure is located on the substrate in the second region. The first hard mask layer is located on the transistor structure. The first hard mask layer has recesses. The hard mask marks are located in the recesses. The second hard mask layer is located on the substrate in the first region. The second hard mask layer has openings. The contacts are located in the openings.

The invention provides a manufacturing method of a semiconductor structure, which include the following steps. A substrate is provided. The substrate includes a first region and a second region. Buried word line structures are formed in the substrate in the first region. A transistor structure is formed on the substrate in the second region. A first hard mask layer is formed on the transistor structure. Recesses is formed in the first hard mask layer. Hard mask marks are formed in the recesses. A second hard mask layer is formed on the substrate in the first region. The second hard mask layer has first openings. Contacts are formed in the first openings.

Based on the above description, in the semiconductor structure and the manufacturing method thereof according to the invention, the first hard mask layer has the recesses, and the hard mask marks are located in the recesses. Therefore, in the process of forming the second hard mask layer, there is no need to additionally form a patterned photoresist layer for protecting the second region, so the number of photomasks can be reduced, and the manufacturing cost and the process complexity can be effectively reduced. In addition, the first hard mask layer and the hard mask marks can prevent the transistor structure in the second region from being damaged in the process of forming the contacts.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1H are cross-sectional views illustrating a manufacturing process of a semiconductor structure according to some embodiments of the invention.

Figure 1A:
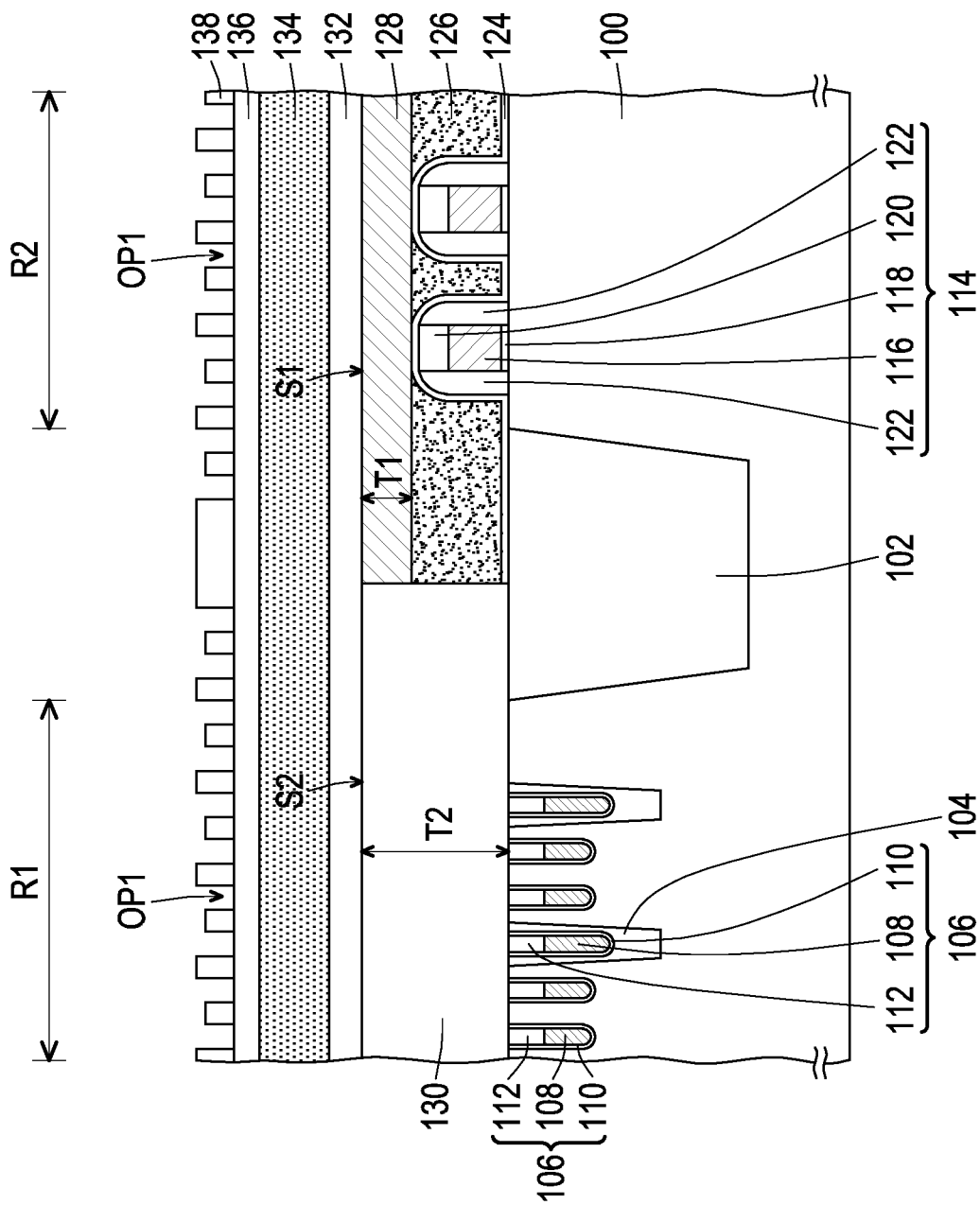
FIG. 1A to FIG. 1H are cross-sectional views illustrating a manufacturing process of a semiconductor structure according to some embodiments of the invention.

Referring to FIG. 1A, a substrate 100 is provided. The substrate 100 includes a first region R1 and a second region R2. In some embodiments, the first region R1 may be a memory region (e.g., dynamic random access memory (DRAM) region), and the second region R2 may be a peripheral circuit region. The substrate 100 may be a semiconductor substrate such as a silicon substrate. In addition, the required components such as a doped region (not shown) may be formed in the substrate 100 according to the product requirement, and the description thereof is omitted here.

In some embodiments, an isolation structure 102 may be formed in the substrate 100 between the first region R1 and the second region R2. The isolation structure 102 may be a single-layer structure or a multilayer structure. The isolation structure 102 is, for example, a shallow trench isolation (STI) structure. The material of the isolation structure 102 is, for example, oxide (e.g., silicon oxide), nitride (e.g., silicon nitride), or a combination thereof.

In some embodiments, an isolation structure 104 may be formed in the substrate 100 in the first region R1. The isolation structure 104 may be a single-layer structure or a multilayer structure. The isolation structure 104 is, for example, a STI structure. The material of the isolation structure 104 is, for example, oxide (e.g., silicon oxide), nitride (e.g., silicon nitride), or a combination thereof.

In addition, buried word line structures 106 are formed in the substrate 100 in the first region R1. The buried word line structure 106 may include a buried word line 108 and a dielectric layer 110. The buried word line 108 is located in the substrate 100. The buried word line 108 may be a single-layer structure or a multilayer structure. The material of the buried word line 108 is, for example, tungsten, titanium, titanium nitride, or a combination thereof. The dielectric layer 110 is located between the buried word line 108 and the substrate 100. The material of the dielectric layer 110 is, for example, oxide (e.g., silicon oxide). In addition, the buried word line structure 106 may further include a hard mask layer 112. The hard mask layer 112 is located on the buried word line 108. The dielectric layer 110 may be further located between the hard mask layer 112 and the substrate 100. The material of the hard mask layer 112 is, for example, nitride (e.g., silicon nitride). The buried word line structures 106 may be further formed in the isolation structure 104.

Furthermore, a transistor structure 114 is formed on the substrate 100 in the second region R2. The transistor structure 114 may include a gate 116 and a dielectric layer 118. The gate 116 is located on the substrate 100. The gate 116 may be a single-layer structure or a multilayer structure. The material of the gate 116 is, for example, doped polysilicon, tungsten, titanium, titanium nitride, or a combination thereof. The dielectric layer 118 is located between the gate 116 and the substrate 100. The material of the dielectric layer 118 is, for example, oxide (e.g., silicon oxide). The transistor structure 114 may further include a hard mask layer 120. The hard mask layer 120 is located on the gate 116. The material of the hard mask layer 120 is, for example, nitride (e.g., silicon nitride). The transistor structure 114 may further include a spacer 122. The spacer 122 is located on the sidewall of the gate 116. The spacer 122 may be a single-layer structure or a multilayer structure. The material of the spacer 122 is, for example, oxide (e.g., silicon oxide), nitride (e.g., silicon nitride), or a combination thereof. In addition, the transistor structure 114 may further include the required components such as a source region and a drain region (not shown), and the description thereof is omitted here.

In some embodiments, a stop layer 124 may be formed on the transistor structure 114. The stop layer 124 may be further formed on the substrate 100 and the isolation structure 102. The stop layer 124 may be a contact etch stop layer. The material of the stop layer 124 is, for example, nitride (e.g., silicon nitride). In some embodiments, a dielectric layer 126 may be formed on the stop layer 124. The material of the dielectric layer 126 is, for example, oxide (e.g., silicon oxide).

Moreover, a hard mask layer 128 is formed on the transistor structure 114. The material of the hard mask layer 128 is, for example, nitride (e.g., silicon nitride). In addition, a dielectric layer 130 may be formed on the substrate 100 in the first region R1. The dielectric layer 130 may be further formed on the isolation structure 102. The thickness T2 of the dielectric layer 130 may be greater than the thickness T1 of the hard mask layer 128. The material of the dielectric layer 130 is, for example, oxide (e.g., silicon oxide such as spin on glass (SOG)). In some embodiments, the top surface S1 of the hard mask layer 128 and the top surface S2 of the dielectric layer 130 may have the same height.

A hard mask layer 132 may be formed on the dielectric layer 130 and the hard mask layer 128. The material of the hard mask layer 132 is, for example, oxide (e.g., silicon oxide). The method of forming the hard mask layer 132 is, for example, a chemical vapor deposition (CVD) method. A hard mask layer 134 may be formed on the hard mask layer 132. The material of the hard mask layer 134 is, for example, carbon. The method of forming the hard mask layer 134 is, for example, a CVD method. A hard mask layer 136 may be formed on the hard mask layer 134, and the material of the hard mask layer 136 is, for example, nitride (e.g., silicon nitride). The method of forming the hard mask layer 136 is, for example, a CVD method.

A patterned hard mask layer 138 may be formed on the hard mask layer 128 and the dielectric layer 130. In some embodiments, the patterned hard mask layer 138 may be formed on the hard mask layer 136. The patterned hard mask layer 138 may have openings OP1. The openings OP1 may be located in the first region R1 and the second region R2. The openings OP1 may be further located above the isolation structure 102. The material of the patterned hard mask layer 138 is, for example, oxide (e.g., silicon oxide). In some embodiments, the patterned hard mask layer 138 may be formed by a self-alignment double patterning (SADP) process.

Figure 1B:
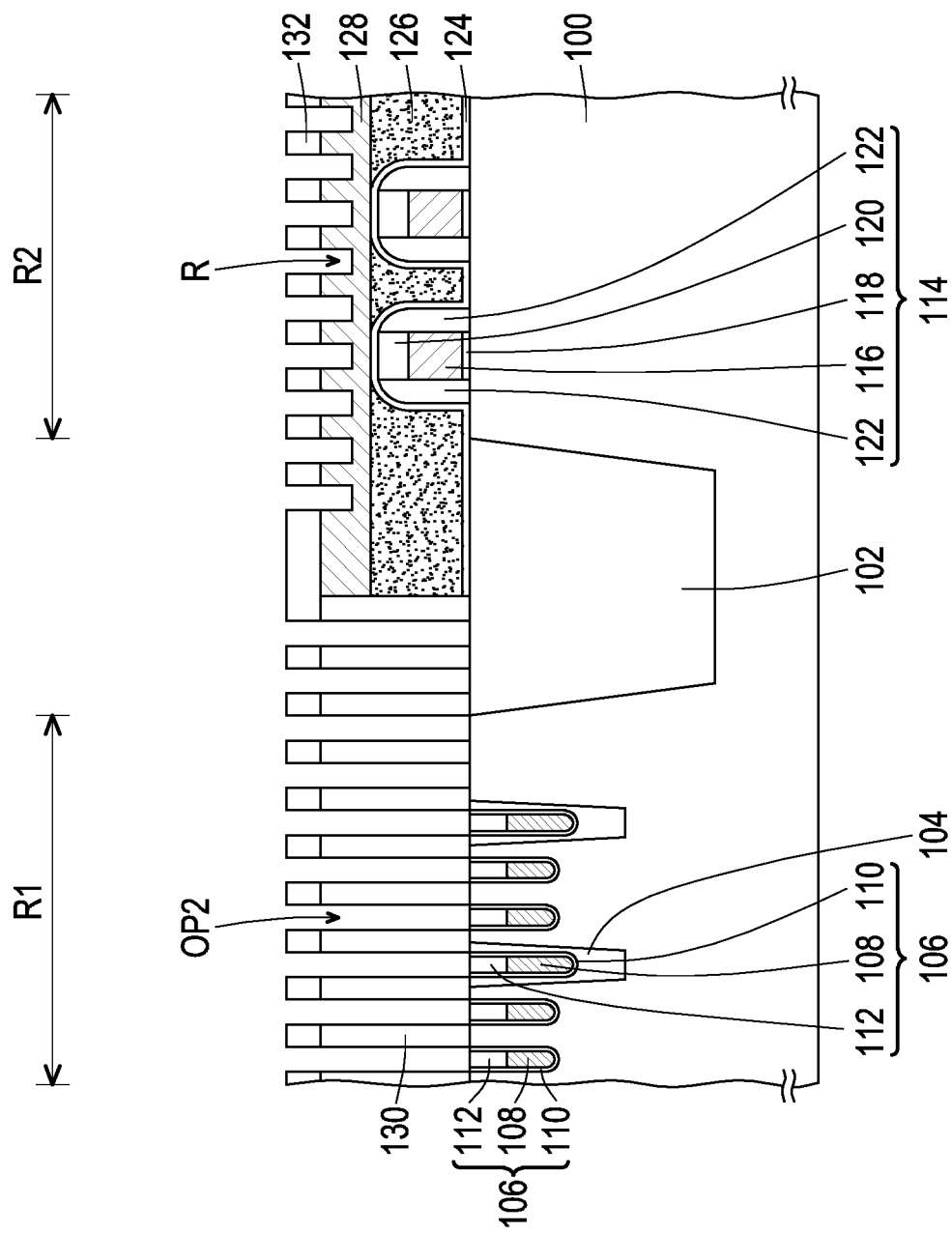

Referring to FIG. 1B, the patterns of the openings OP1 may be transferred to the hard mask layer 128 and the dielectric layer 130 to form recesses R in the hard mask layer 128 and to form openings OP2 in the dielectric layer 130. In the process of transferring the patterns of the openings OP1 to the hard mask layer 128 and the dielectric layer 130, the patterned hard mask layer 138, the hard mask layer 136, and the hard mask layer 134 may be removed. In the process of transferring the patterns of the openings OP1 to the hard mask layer 128 and the dielectric layer 130, the patterns of the openings OP1 may be further transferred to the hard mask layer 132. The method of transferring the patterns of the openings OP1 to the hard mask layer 128 and the dielectric layer 130 may include performing a dry etching process on the hard mask layer 128 and the dielectric layer 130. In the dry etching process, the etching rate of the dielectric layer 130 may be greater than the etching rate of the hard mask layer 128. In the dry etching process, the etching rate of the dielectric layer 130 may be 3 to 10 times the etching rate of the hard mask layer 128.

Figure 1C:
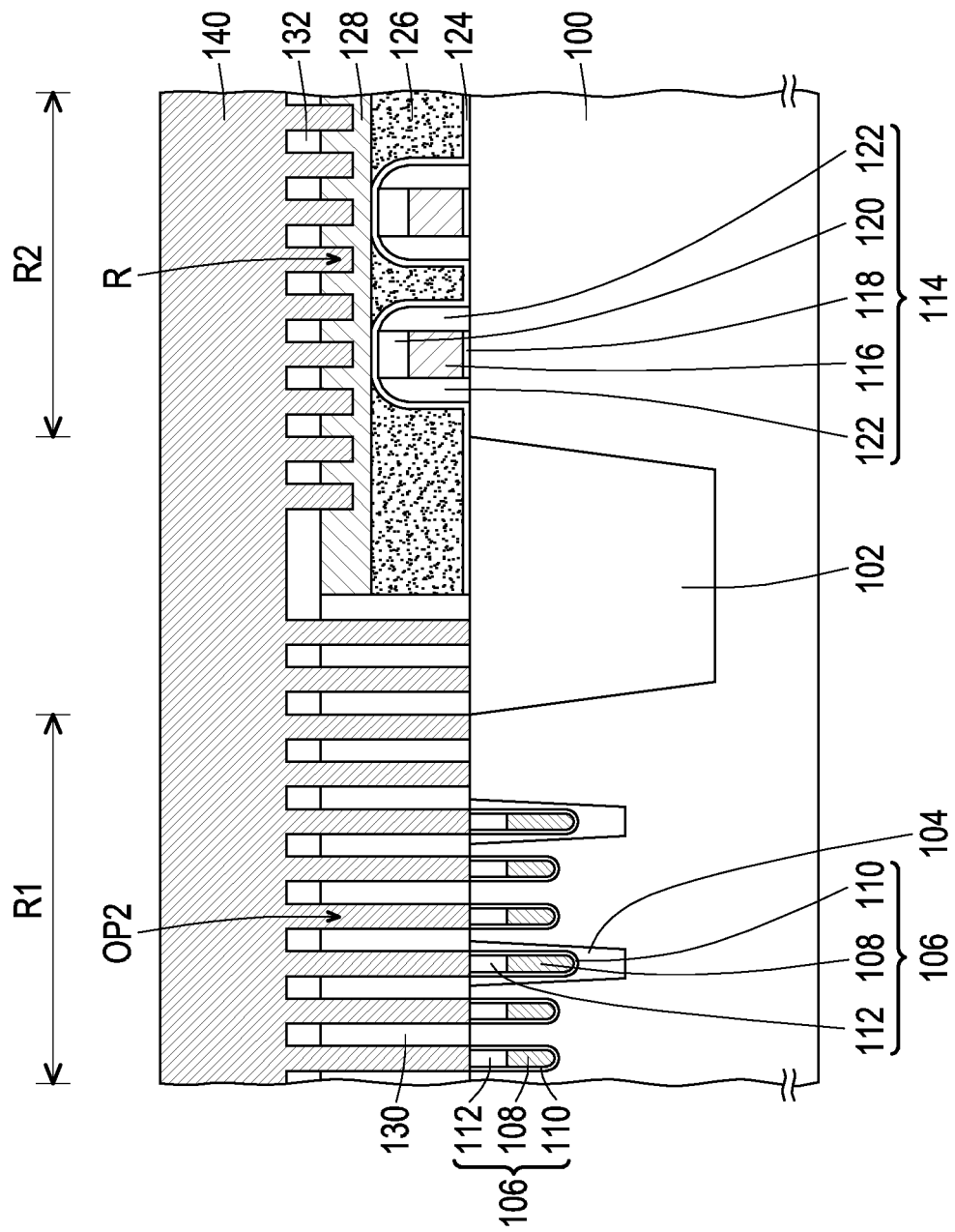

Referring to FIG. 1C, a hard mask material layer 140 may be formed on the hard mask layer 128 and the dielectric layer 130. In some embodiments, the hard mask material layer 140 may be formed on the hard mask layer 132. The hard mask material layer 140 fills the recesses R and the openings OP2. The material of the hard mask material layer 140 is, for example, nitride (e.g., silicon nitride). The method of forming the hard mask material layer 140 is, for example, a CVD method.

Figure 1D:
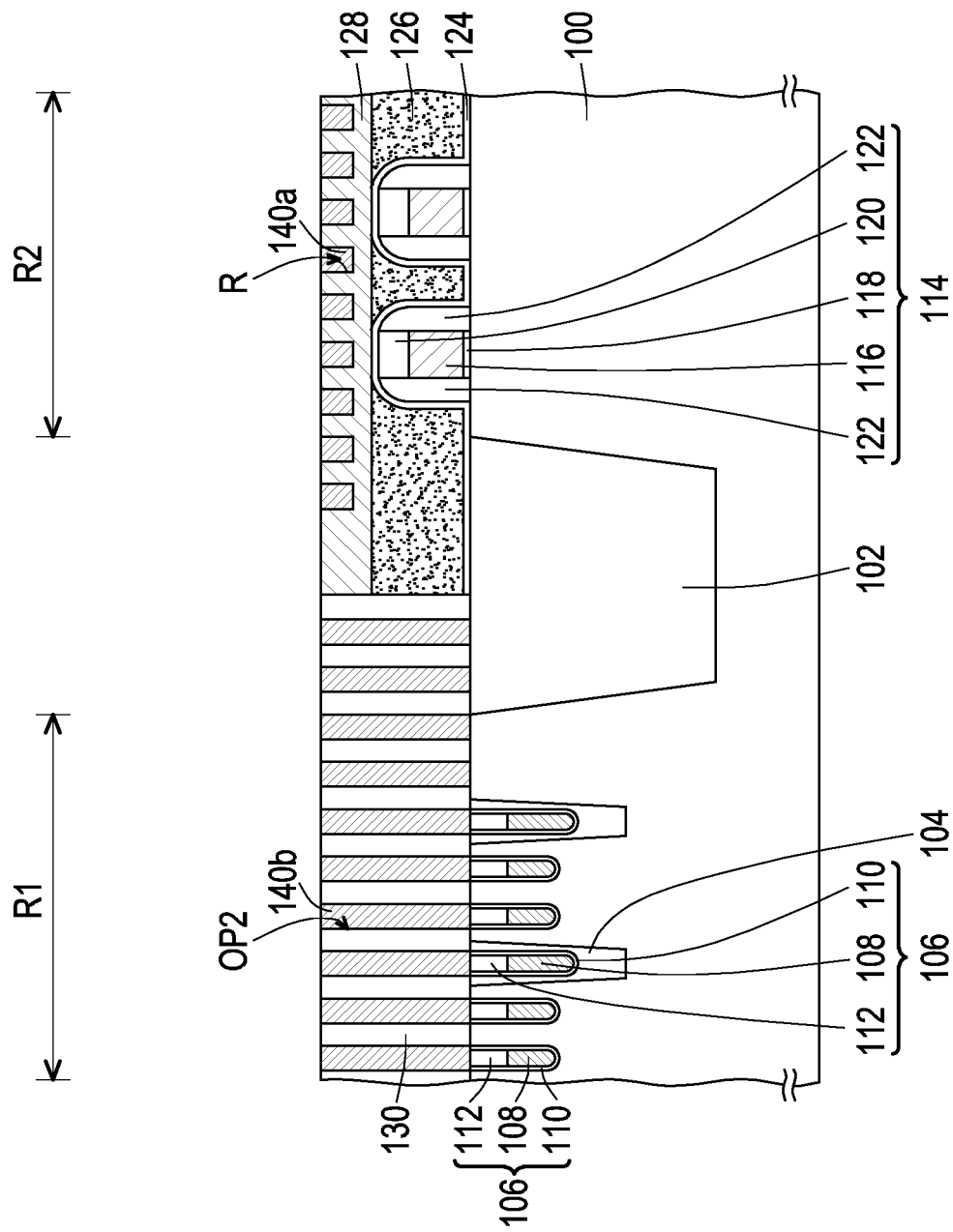

Referring to FIG. 1D, the hard mask material layer 140 located outside the recesses R and outside the openings OP2 may be removed to form hard mask marks 140a and a hard mask layer 140b. Therefore, the hard mask marks 140a may be formed in the recesses R. and the hard mask layer 140b may be formed on the substrate 100 in the first region R1. In some embodiments, the hard mask marks 140a and the hard mask layer 140b may be simultaneously formed. A portion of the hard mask marks 140a may be formed directly above the isolation structure 102. The hard mask layer 140b may be further formed on the isolation structure 102. In the process of removing the hard mask material layer 140 located outside the recesses R and outside the openings OP2, the hard mask layer 132 may be removed. The method of removing the hard mask material layer 140 located outside the recesses R and outside the openings OP2 is, for example, a dry etching method. The materials of the hard mask marks 140a are, for example, nitride (e.g., silicon nitride). The material of the hard mask layer 140b is, for example, nitride (e.g., silicon nitride).

Figure 1E:
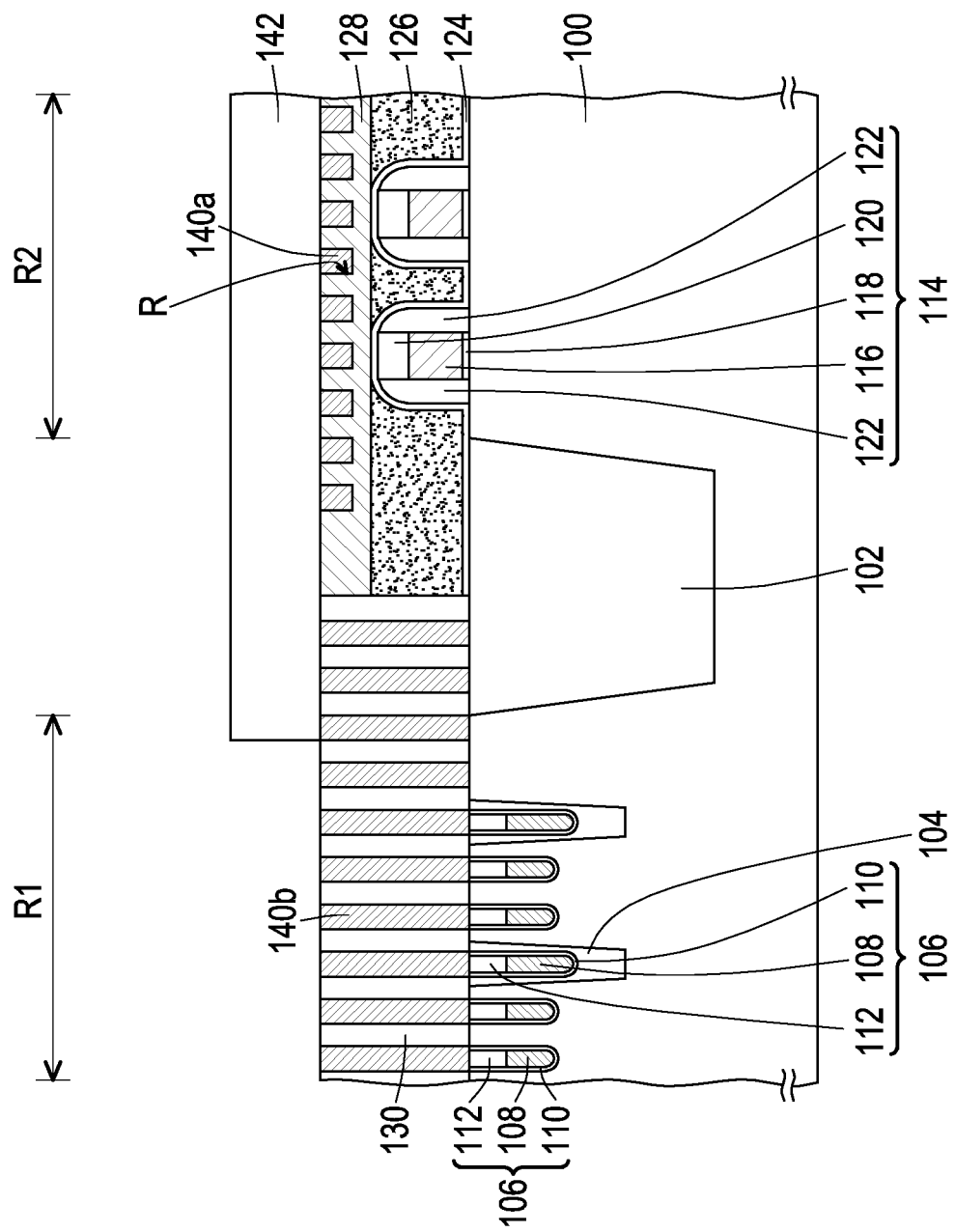

Referring to FIG. 1E, a patterned photoresist layer 142 may be formed on the hard mask layer 128, the hard mask marks 140a, the dielectric layer 130, and the hard mask layer 140b. The patterned photoresist layer 142 may expose a portion of the dielectric layer 130 located in the first region R1 and a portion of the hard mask layer 140b located in the first region R1.

Figure 1F:
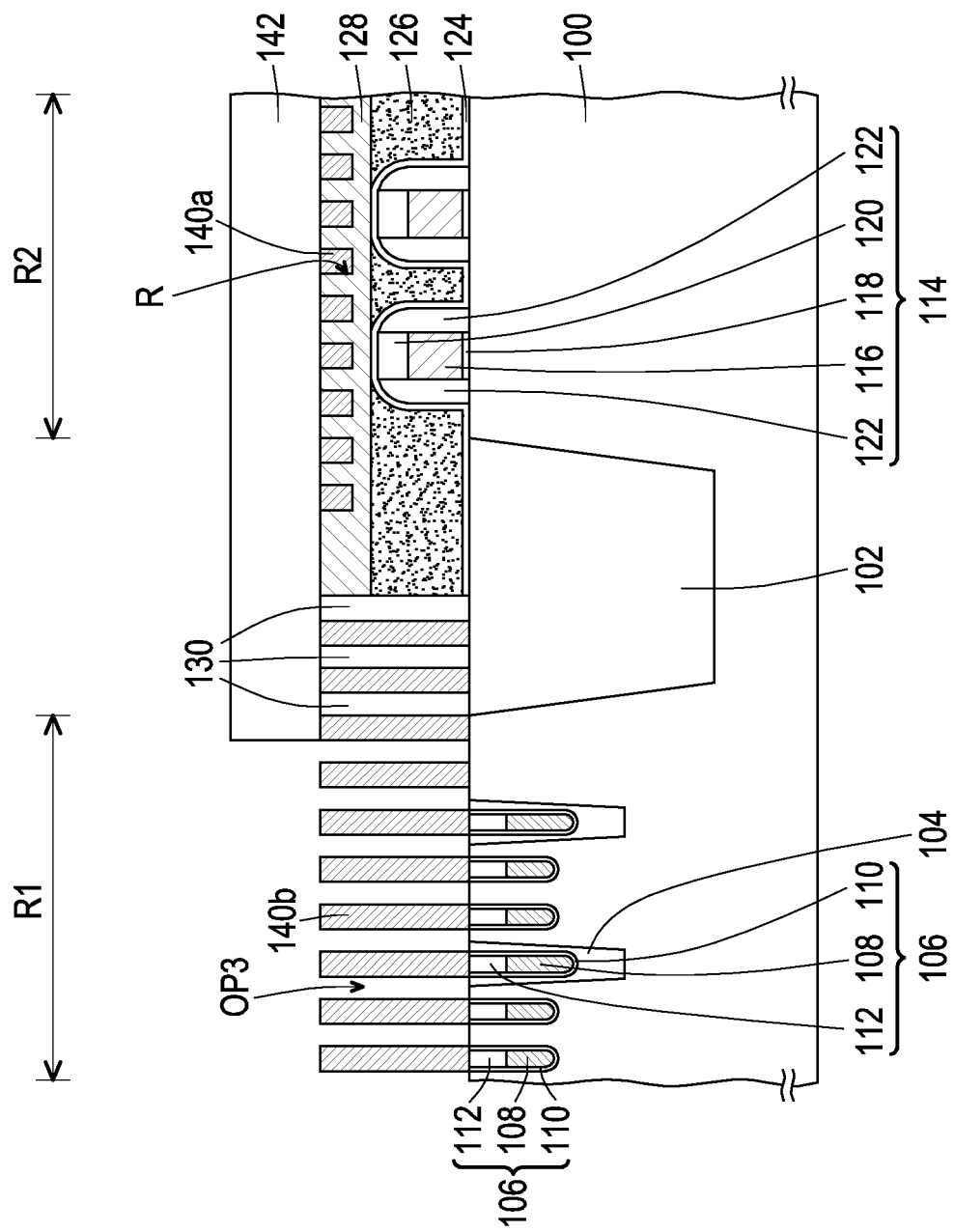

Referring to FIG. 1F, the dielectric layer 130 located in the first region R1 may be removed by using the patterned photoresist layer 142 as a mask, so that the hard mask layer 140b has openings OP3. The method of removing the dielectric layer 130 located in the first region R1 is, for example, a wet etching method.

Figure 1G:
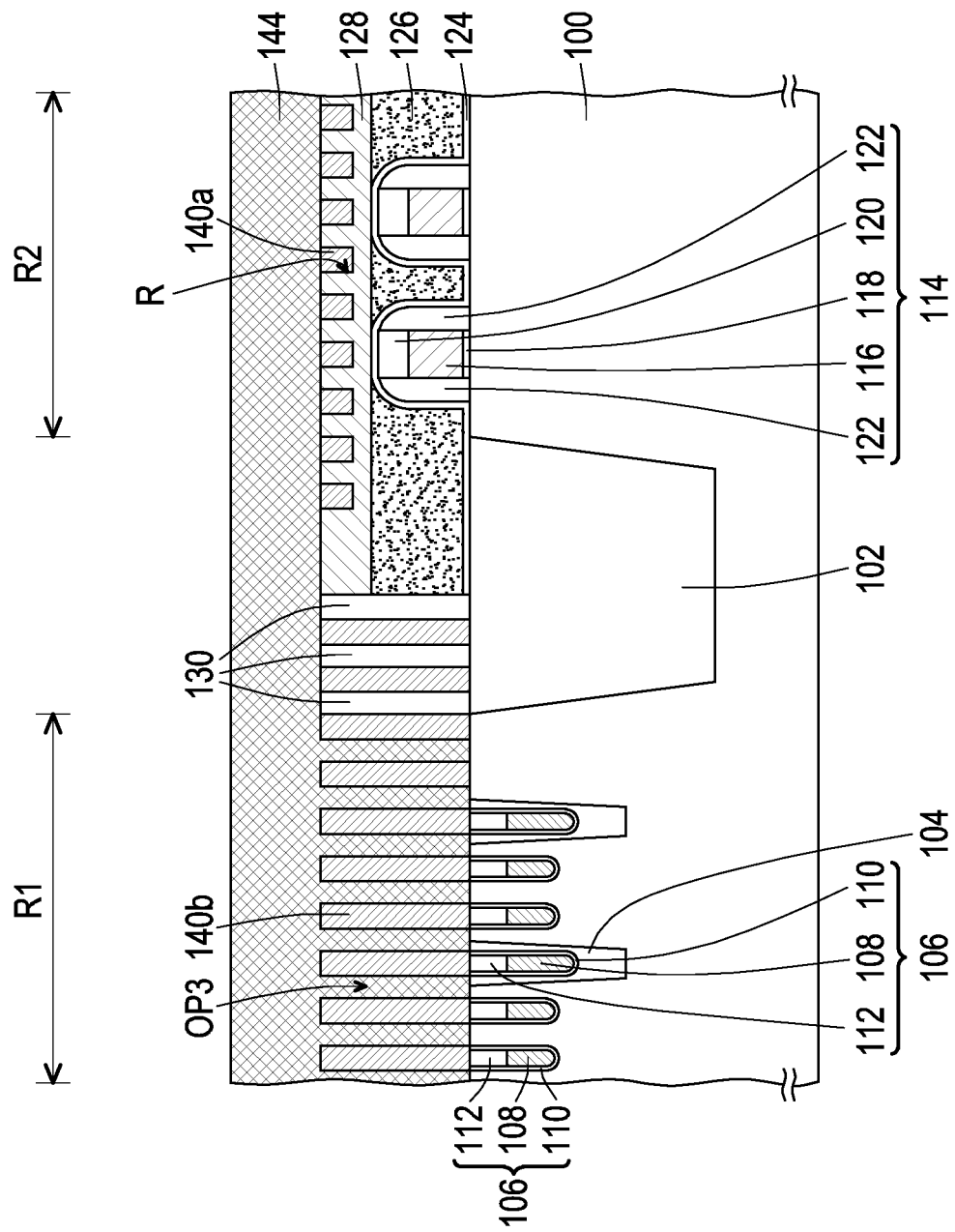

Referring to FIG. 1G, the patterned photoresist layer 142 may be removed. A contact material layer 144 may be formed on the hard mask layer 128, the hard mask marks 140a, the dielectric layer 130, and the hard mask layer 140b, and the contact material layer 144 fills the openings OP3. The material of the contact material layer 144 is, for example, a conductive material such as doped polysilicon. The method of forming the contact material layer 144 is, for example, a CVD method.

Figure 1H:
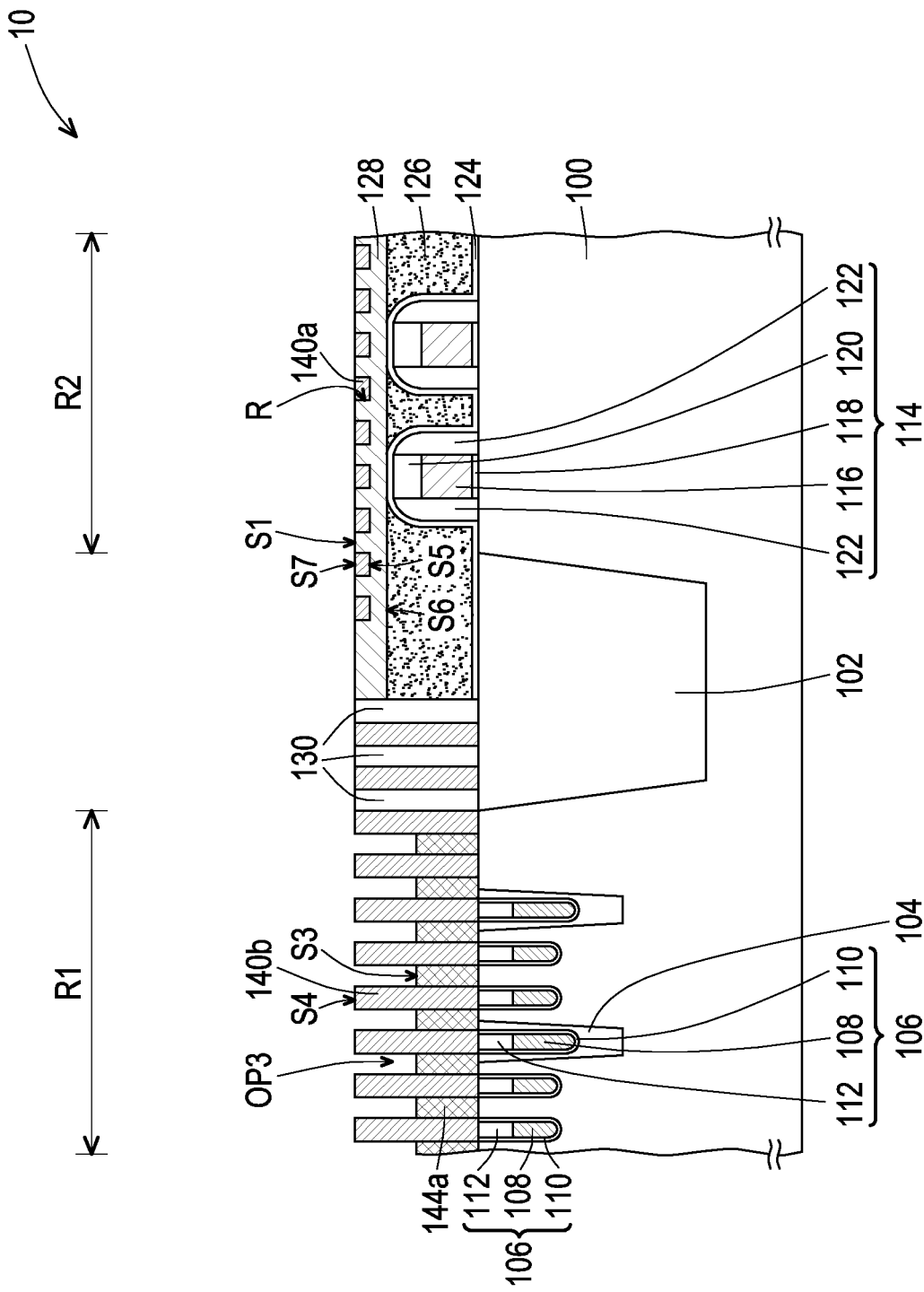

Referring to FIG. 1H, an etch-back process may be performed on the contact material layer 144 to form contacts 144a. Therefore, the contacts 144a may be formed in the openings OP3. In some embodiments, the top surface S3 of the contact 144a may be lower than the top surface S4 of the hard mask layer 140b. The etch-back process is, for example, a dry etching process. In some embodiments, in the etch-back process (e.g., dry etching process), a portion of the hard mask layer 128, a portion of the hard mask mark 140a, a portion of the dielectric layer 130, and a portion of the hard mask layer 140b may be removed to reduce the height of the hard mask layer 128, the height of the hard mask mark 140a, the height of the dielectric layer 130, and the height of the hard mask layer 140b.

In addition, other components (e.g., capacitors and other contacts) of the memory (e.g., DRAM) may be formed in the first region R1 in the subsequent manufacturing process, and the description thereof is omitted here.

Hereinafter, the semiconductor structure 10 of the above embodiment will be described with reference to FIG. 1H. In addition, although the method for forming the semiconductor structure 10 is described by taking the above method as an example, the invention is not limited thereto.

Referring to FIG. 1H, the semiconductor structure 10 includes a substrate 100, buried word line structures 106, a transistor structure 114, a hard mask layer 128, hard mask marks 140a, a hard mask layer 140b, and contacts 144a. The substrate 100 includes a first region R1 and a second region R2. The buried word line structures 106 are located in the substrate 100 in the first region R1. The transistor structure 114 is located on the substrate 100 in the second region R2. The hard mask layer 128 is located on the transistor structure 114. The hard mask layer 128 has recesses R. In some embodiments, the recesses R may not pass through the hard mask layer 128. The hard mask marks 140a are located in the recesses R. In some embodiments, a portion of the hard mask marks 140a may be located directly above the gate 116. In some embodiments, the bottom surfaces S5 of the hard mask marks 140a may be higher than the bottom surface S6 of the hard mask layer 128. The hard mask layer 140b is located on the substrate 100 in the first region R1. The hard mask layer 140b has openings OP3. In some embodiments, the top surface S1 of the hard mask layer 128, the top surfaces S7 of the hard mask marks 140a, and the top surface S4 of the hard mask layer 140b may have the same height. The contacts 144a are located in the openings OP3.

The semiconductor structure 10 may further include at least one of a dielectric layer 126, a stop layer 124, an isolation structure 102, a dielectric layer 130, and an isolation structure 104. The dielectric layer 126 is located on the substrate 100 aside the transistor structure 114. In some embodiments, the hard mask layer 128 may be further located on the dielectric layer 126. The stop layer 124 is located between the dielectric layer 126 and the substrate 100 and between the hard mask layer 128 and the transistor structure 114. The isolation structure 102 is located in the substrate 100 between the first region R1 and the second region R2. In some embodiments, a portion of the hard mask layer 140b may be located on the isolation structure 102. The dielectric layer 130 is located on the isolation structure 102.

In some embodiments, a portion of the hard mask layer 140b may be located in the dielectric layer 130. In some embodiments, a portion of the hard mask marks 140a may be located directly above the isolation structure 102. In some embodiments, the dielectric layer 126 may be further located between the hard mask layer 128 and the isolation structure 102. In some embodiments, the stop layer 124 may be further located between the dielectric layer 126 and the isolation structure 102. The isolation structure 104 is located in the substrate 100 in the first region R1. In some embodiments, the buried word line structures 106 may be further located in the isolation structure 104.

In addition, the details (e.g., the material and the forming method) of each component in the semiconductor structure 10 have been described in detail in the above embodiments, and the description thereof is not repeated here.

Based on the above embodiments, in the semiconductor structure 10 and the manufacturing method thereof, the hard mask layer 128 has the recesses R, and the hard mask marks 140a are located in the recesses R. Therefore, in the process of forming the hard mask layer 140b, there is no need to additionally form a patterned photoresist layer for protecting the second region R2, so the number of photomasks can be reduced, and the manufacturing cost and the process complexity can be effectively reduced. In addition, the hard mask layer 128 and the hard mask marks 140a can prevent the transistor structure 114 in the second region R2 from being damaged in the process of forming the contacts 144a.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate comprising a first region and a second region;
   buried word line structures located in the substrate in the first region;
   a transistor structure located on the substrate in the second region;
   a first hard mask layer located on the transistor structure and having recesses;
   hard mask marks located in the recesses;
   a second hard mask layer located on the substrate in the first region and having openings; and
   contacts located in the openings.

2. The semiconductor structure according to claim 1, wherein bottom surfaces of the hard mask marks are higher than a bottom surface of the first hard mask layer.

3. The semiconductor structure according to claim 1, wherein the recesses do not pass through the first hard mask layer.

4. The semiconductor structure according to claim 1, wherein the transistor structure comprises a gate, and a portion of the hard mask marks is located directly above the gate.

5. The semiconductor structure according to claim 1, wherein a top surface of the first hard mask layer, top surfaces of the hard mask marks, and a top surface of the second hard mask layer have the same height.

6. The semiconductor structure according to claim 1, further comprising:
   a dielectric layer located on the substrate aside the transistor structure, wherein the first hard mask layer is further located on the dielectric layer, a material of the dielectric layer comprises oxide, a material of the first hard mask layer comprises nitride, materials of the hard mask marks comprise nitride, and a material of the second hard mask layer comprises nitride.

7. The semiconductor structure according to claim 6, further comprising:
a stop layer located between the dielectric layer and the substrate and between the first hard mask layer and the transistor structure.

8. The semiconductor structure according to claim 1, further comprising:
an isolation structure located in the substrate between the first region and the second region, wherein a portion of the second hard mask layer is located on the isolation structure.

9. The semiconductor structure according to claim 8, further comprising:
a dielectric layer located on the isolation structure, wherein a portion of the second hard mask layer is located in the dielectric layer.

10. The semiconductor structure according to claim 8, wherein a portion of the hard mask marks is located directly above the isolation structure.

11. The semiconductor structure according to claim 1, further comprising:
an isolation structure located in the substrate in the first region, wherein the buried word line structures are further located in the isolation structure.

12. A manufacturing method of a semiconductor structure, comprising:
providing a substrate, wherein the substrate comprises a first region and a second region;
forming buried word line structures in the substrate in the first region;
forming a transistor structure on the substrate in the second region;
forming a first hard mask layer on the transistor structure;
forming recesses in the first hard mask layer;
forming hard mask marks in the recesses;
forming a second hard mask layer on the substrate in the first region, wherein the second hard mask layer has first openings; and
forming contacts in the first openings.

13. The manufacturing method of the semiconductor structure according to claim 12, wherein the hard mask marks and the second hard mask layer are simultaneously formed.

14. The manufacturing method of the semiconductor structure according to claim 12, wherein a method of forming the recesses, the hard mask marks, and the second hard mask layer comprises:
forming a dielectric layer on the substrate in the first region;
forming a patterned hard mask layer on the first hard mask layer and the dielectric layer, wherein the patterned hard mask layer has second openings;
transferring patterns of the second openings to the first hard mask layer and the dielectric layer to form the recesses in the first hard mask layer and to form third openings in the dielectric layer;
forming a hard mask material layer on the first hard mask layer and the dielectric layer, wherein the hard mask material layer fills the recesses and the third openings; and
removing the hard mask material layer located outside the recesses and outside the third openings to form the hard mask marks and the second hard mask layer.

15. The manufacturing method of the semiconductor structure according to claim 14, wherein a method of transferring the patterns of the second openings to the first hard mask layer and the dielectric layer comprises performing a dry etching process on the first hard mask layer and the dielectric layer.

16. The manufacturing method of the semiconductor structure according to claim 15, wherein
a thickness of the dielectric layer is greater than a thickness of the first hard mask layer, and
in the dry etching process, an etching rate of the dielectric layer is greater than an etching rate of the first hard mask layer.

17. The manufacturing method of the semiconductor structure according to claim 15, wherein in the dry etching process, an etching rate of the dielectric layer is 3 to 10 times an etching rate of the first hard mask layer.

18. The manufacturing method of the semiconductor structure according to claim 14, further comprising:
forming a third hard mask layer on the dielectric layer and the first hard mask layer;
forming a fourth hard mask layer on the third hard mask layer; and
forming a fifth hard mask layer on the fourth hard mask layer, wherein the patterned hard mask layer is formed on the fifth hard mask layer.

19. The manufacturing method of the semiconductor structure according to claim 18, wherein
in the process of transferring the patterns of the second openings to the first hard mask layer and the dielectric layer, the patterned hard mask layer, the fifth hard mask layer, and the fourth hard mask layer are removed, and
in the process of removing the hard mask material layer located outside the recesses and outside the third openings, the third hard mask layer is removed.

20. The manufacturing method of the semiconductor structure according to claim 14, further comprising:
removing the dielectric layer located in the first region after forming the hard mask marks and the second hard mask layer, so that the second hard mask layer has the first openings.

* * * * *